(12) United States Patent
Labanok et al.

(10) Patent No.: US 6,882,535 B2
(45) Date of Patent: Apr. 19, 2005

(54) INTEGRATED HEAT SPREADER WITH DOWNSET EDGE, AND METHOD OF MAKING SAME

(75) Inventors: Nick Labanok, Phoenix, AZ (US); Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/405,055

(22) Filed: Mar. 31, 2003

(65) Prior Publication Data

US 2004/0190259 A1 Sep. 30, 2004

(51) Int. Cl.[7] .............................................. H05K 7/20
(52) U.S. Cl. ..................... 361/704; 361/709; 361/719; 257/706; 165/185
(58) Field of Search ................................ 361/688–690, 361/702–705, 719, 722, 736, 749; 174/16.3, 52.4; 165/80.3, 185; 257/706, 711, 712–713, 722

(56) References Cited

U.S. PATENT DOCUMENTS

| | | | | |
|---|---|---|---|---|
| 4,561,011 A | * | 12/1985 | Kohara et al. ............... | 257/713 |
| 5,396,403 A | * | 3/1995 | Patel .......................... | 361/705 |
| 5,459,352 A | * | 10/1995 | Layton et al. ............... | 257/724 |
| 5,587,882 A | * | 12/1996 | Patel .......................... | 361/705 |
| 5,926,371 A | * | 7/1999 | Dolbear ....................... | 361/704 |
| 5,931,222 A | * | 8/1999 | Toy et al. .................... | 165/80.3 |
| 6,008,536 A | * | 12/1999 | Mertol ........................ | 257/704 |
| 6,188,578 B1 | * | 2/2001 | Lin et al. .................... | 361/717 |
| 6,462,410 B1 | * | 10/2002 | Novotny et al. ............. | 257/707 |
| 6,469,380 B1 | * | 10/2002 | Sorimachi et al. .......... | 257/706 |
| 6,504,243 B1 | * | 1/2003 | Andric et al. ............... | 257/718 |
| 6,656,770 B1 | * | 12/2003 | Atwood et al. ............. | 438/118 |

FOREIGN PATENT DOCUMENTS

JP          3002174          1/1991

* cited by examiner

*Primary Examiner*—Boris Chervinsky
(74) *Attorney, Agent, or Firm*—Schwegman, Lundberg, Woessner & Kluth, P.A.

(57) ABSTRACT

A downset edge integrated heat spreader is disclosed. The downset edge can be formed to an industrially accepted flatness with a single stamping operation. The downset edge can provide a surface for fastening the downset edge integrated heat spreader to a mounting substrate. The downset edge can also provide a component recess for mounting a component near a processor, but on the mounting substrate. The downset edge can also provide a warp and bend resistant structure during ordinary field use.

30 Claims, 6 Drawing Sheets

US 6,882,535 B2

INTEGRATED HEAT SPREADER WITH DOWNSET EDGE, AND METHOD OF MAKING SAME

TECHNICAL FIELD

Disclosed embodiments relate to an integrated heat spreader with a downset edge. More particularly, disclosed embodiments relate to an integrated heat spreader with a minimum deviation from planarity. Disclosed embodiments also include a process of forming the integrated heat spreader by a single-stamping process.

BACKGROUND INFORMATION

Description of Related Art

An integrated circuit (IC) die is often fabricated into a microelectronic device such as a processor. The increasing power consumption of processors results in tighter thermal budgets for a thermal solution design when the processor is employed in the field. Accordingly, a thermal interface is often needed to allow the die to reject heat more efficiently.

Various techniques have been employed to transfer heat away from a die. These techniques include passive and active configurations. One passive configuration involves a conductive material in thermal contact with the backside of a packaged die. This conductive material is often a slug, a heat spreader, or an integrated heat spreader (IHS).

A heat spreader is employed to spread and dissipate the heat generated by a die, which minimizes concentrated high-heat locations within the die. A heat spreader is attached proximate the back side of a microelectronic die with a thermally conductive material, such as a thermal interface material (TIM) A TIM can include, for example, thermally conductive gels, thermal greases, or solders. Heat spreaders include materials such as aluminum, copper, copper alloy, or ceramic, among others.

With conventional technology, a packaged microelectronic device includes a die which is bonded from the back side to an integrated heat spreader (IHS). An IHS adhesive layer acts as a TIM to bond the die to the IHS. The conventional IHS includes a lip portion that is formed by a bending process which gives rise to less than complete filling into the corner of the bend. Additionally to form the lip portion of the HIS from a rectangular blank, several stamping processes are required to achieve a sufficiently flat upper and lower surfaces to achieve quality bonds with other structures such as heat sinks and dies, respectively. These stamping processes result in a relatively low yield range in the production of heat spreaders, due, at least in part, to the processes used for forming heat spreaders. Additionally, the stamping processes result in a significant variation in flatness of the top surface of the IHS, as well as the bottom surface. The variation in flatness can detrimentally affect adhesion to either side of the IHS.

The current IHS, typically manufactured from a high purity copper alloy, is difficult to form with existing stamping equipment limitations, especially with respect to maintaining high raw material yield metrics & fully-filled corner geometries that are achieved with the stamping process. In order to completely fill the corner locations of the IHS, typical industry raw material yields range as low as 35%, yet utilize multi-stage manufacturing with high-tonnage machinery.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations.

Reference will now be made to the drawings wherein like structures will be provided with like reference designations. In order to show the structures of embodiments most clearly, the drawings included herein are diagrammatic representations of inventive articles. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1:
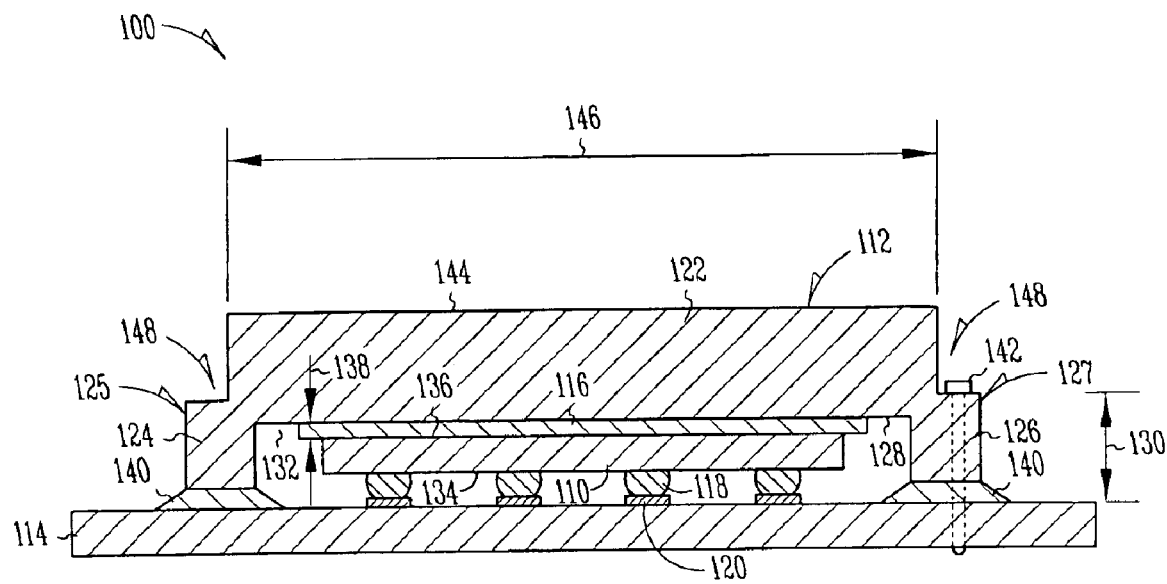
FIG. 1 is a cross section of a microelectronic package according to an embodiment.

FIG. 1 is a cross section of a microelectronic package according to an embodiment. FIG. 1 depicts a microelectronic package 100 including a die 110 connected to a downset edge integrated heat spreader (IHS) 112 and a mounting substrate 114. An IHS adhesive layer 116 acts as a thermal interface material (TIM) to bond the die 110 to the downset edge IHS 112. The die 110 is coupled to the mounting substrate 114 through a series of electrical bumps 118 that are mounted on a series of bond pads 120 that are disposed upon the mounting substrate 114.

The downset edge IHS 112 includes a heat spreader body 122 and downset edges 124 and 126. The downset edges appear as feet 124, 126 portions of the downset edge IHS 112. Because the microelectronic package 100 is depicted in orthogonal cross section, the downset edges 124 and 126 are depicted as two separate downset edges. The downset edge walls 125, 127 of the downset edges 124 and 126, respectively, form a perimeter for the entire downset edge IHS 112. In one embodiment, the perimeter, delineated at the downset edge walls 125 and 127, concentrically surrounds the heat spreader body 122 as it also delineates the entire perimeter of the downset edge IHS 112. The downset edges 124 and 126 are downset from the heat spreader body bottom surface 128 by a foot height 130. The foot height 130 forms a container recess 132 between the one or more downset edges 124, 126 and the bottom surface 128 of the downset edge IHS 112. The dimension of the container recess 132 is approximately as deep as the thickness of the die 110, the IHS adhesive layer 116, the electrical bump 118, and the bond pad 120, if present.

The die 110 includes an active surface 134 and a backside surface 136. The adhesive layer 116 forms a bond line thickness (BLT) 138 between the backside surface 136 of the die 110 and the bottom surface 128 of the downset edge IHS 112.

In a die-referenced process of assembling the microelectronic package 100, the BLT 138 must take into account any particulates in the adhesive layer 116. In one embodiment, the adhesive layer 116 includes a polymer. In one embodiment, the adhesive layer 116 includes a polymer with heat transfer particulates disposed embodiment, the adhesive layer 116 includes a solder with heat transfer particulates disposed therein. In one embodiment, the adhesive layer 116 includes a polymer-solder hybrid (PSH). In one embodiment, the adhesive layer 116 includes a PSH with heat transfer particulates disposed therein. In one embodiment the heat transfer particulates include graphite flakes and/or filaments. In one embodiment the heat transfer particulates include diamond solids. In one embodiment the heat transfer particulates include metals with a higher coefficient of thermal conductivity than the bulk of the adhesive layer 116.

In one embodiment, the downset edge IHS 112 is attached to the mounting substrate 114 by an attachment material 140, such as a polymer or the like or another conventional sealant. In one embodiment the attachment material 140 is applied to at least a portion of the downset edges 124 or 126. Attachment of the downset edge IHS 112 to the mounting substrate 114 may be by any number of methods, including but not limited to pressing, application of epoxy, soldering, or any suitable method known in the art. Additionally, mechanical attachment devices, such as a fastener 142 may be used to attach the downset edge IHS 112 to the mounting substrate. In one embodiment, the fastener 142 is a screw. In one embodiment, the fastener 142 is a nut and bolt assembly. In one embodiment, the fastener 142 is a staple. In one embodiment, the fastener 142 is a rivet. In one embodiment, the fastener 142 is a snap. In one embodiment, the fastener 142 is a press-fit taper pin. In one embodiment, the fastener 142 is a press pin. In one embodiment, the fastener is a clip (see FIGS. 5 and 6). By reading this disclosure and practicing the embodiments, it should be apparent that any one, or a combination of fasteners set forth herein, and their respective equivalents can be used if desired.

In one embodiment when the downset edge IHS 112 is attached to the mounting substrate 114, the downset edge walls 125, 127 form an intermittent lip around the die 110 (see FIGS. 5A and 5B). In one embodiment, this intermittent lip may eliminate or reduce the need for a vent hole such as vent hole 332 of FIG. 3, which serves the primary purpose of providing pressure relief inside the package. Additionally one or more of the discontinuities in the non-contiguous lip of the downset edge IHS 112 may serve as attachment locations for secondary devices, as set forth in further detail.

As will be discussed in this disclosure, a notch 148 appears in the downset edge IHS 112. In one embodiment, the notch 148 represents a displacement of the downset edges 124 and 126 away from the heat spreader body 122, due to a stamping process or other process as will be set forth in this disclosure. In one embodiment, the notch 148 represents slip-shear of the downset edges 124 and 126 away from the heat spreader body 122. By a slip-shear action, corner structures as illustrated in FIG. 1 are substantially as dense as any given portion of the downset edge IHS 112. In one embodiment, however, the downset edge IHS 112 is formed by a process such as one of molten casting, injection molding, or dry casting such as a powdered metal composite which can be formed by pressing and/or sintering. In these embodiments, the notch 148 is part of a mold impression.

In one embodiment, the top surface 144 of the downset edge IHS 112 is substantially planar. By "substantially planar" it is understood that a deviation from planarity is minimized. Planarity is defined as a measure of the difference between the highest and lowest vertical points found along the top surface 144, divided by the length 146 of the heat spreader body 122. In one embodiment, the deviation from planarity is in a range from about 0.1 percent to about 0.5 percent. In one embodiment the length 146 of the heat spreader body 122 is in a range from about 5 millimeter (mm) to about 75 mm. In one embodiment the length 146 of the heat spreader body 122 is in a range from about 10 mm to about 50 mm. In one embodiment the length 146 of the heat spreader body 122 is in a range from about 20 mm to about 40 mm. In one embodiment the length 146 of the heat spreader body 122 is about 27 mm. In one embodiment the length 146 of the heat spreader body 122 is about 38.5 mm. In one embodiment the length 146 of the heat spreader body 122 is about 45 mm.

The downset edge IHS 112 as shown in FIG. 1 can be formed by use of one or more cold forming processes, such as, for example, one or more stamping processes. A stamping process may use a slug of material and then stamp out features or dimensions from the slug of material. In one embodiment, a stamping process is used to stamp down one or more downset edges 124, 126 to provide the downset edge IHS 112 set forth in this disclosure. The stamping process is given as one non-limiting method for forming the downset edge IHS 112 as shown and described, but any suitable method for forming a downset edge IHS 112 can be employed.

There are pluralities of methods which may be used to form a downset edge IHS as claimed and described. These methods include, for example, stamping, machining, progressive manufacturing, laser cutting, injection molding, powder metal casting and others. One such method of forming a downset edge IHS includes starting with a mass of material, or slug, and cutting or machining it to a set of dimensions. Thereafter, one or more stamping processes are employed to form the downset edges 124 and 126. In one embodiment, the process includes a single stamping event. In one embodiment, the process includes a plurality of stamping events.

Figure 2:
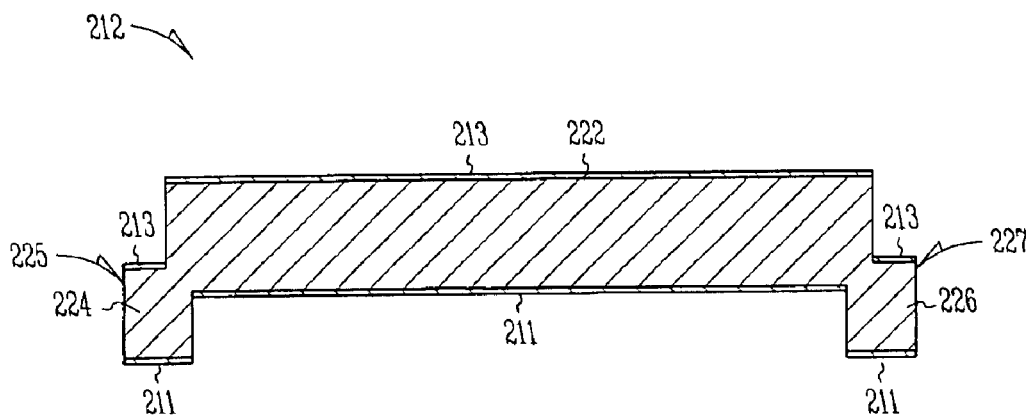
FIG. 2 is a cross section of a downset edge integrated heat spreader according to an embodiment.

FIG. 2 is a side elevation of a downset edge IHS 212 according to an embodiment. In this embodiment, the downset edge IHS 212 includes at least one of a lower cladding layer 211 and an upper cladding layer 213. By "cladding layer", it is understood that a layer has been formed upon a heat sink structure such as the IHS 212. Forming of a "cladding layer" thereon can include at least one of such diverse processes as pressure cladding, electroplating, electroless plating, and other processes. In one embodiment, a rectangular blank of IHS-grade copper is drawn through a molten nickel or molten nickel alloy bath to form at least one of the lower cladding layer 211 and of the upper cladding layer 213. Subsequently, the nickel or nickel alloy-clad rectangular blank is cut. Hence, substantially no nickel or nickel alloy is depicted on laterally exposed surfaces.

After cladding the downset edge IHS 212, a single stamping process is carried out to form the downset edges 224 and 226. The downset edge IHS 212 depicted in FIG. 2 is therefore represented in one embodiment to be a nickel or nickel alloy-clad IHS-grade copper material. In one embodiment, the downset edge IHS 212 is copper a copper alloy. In one embodiment, the downset edge IHS 212 is aluminum or an aluminum alloy. In one embodiment, the downset edge IHS 212 includes a graphite material. In one embodiment, the downset edge IHS 212 includes carbon structures such as carbon fibers and/or carbon particulates. In one embodiment, the downset edge IHS 212 includes a high thermal conductivity material such as diamond. In one embodiment, the downset edge IHS 212 includes a high thermal conductivity material formed from a consolidated metal powder.

Where the downset edge IHS 212 is clad, such as with at least one of the lower cladding layer 211 and the upper cladding layer 213, the cladding material is selected to provide adequate adhesion to the IHS material under ordinary test and field usages. In one embodiment, the cladding material includes nickel or a nickel alloy. In one embodiment, the cladding material includes gold or a gold alloy. In one embodiment, the cladding material includes silver or a silver alloy. Other materials for the IHS and the cladding material can be selected according to specific applications.

Figure 3A:
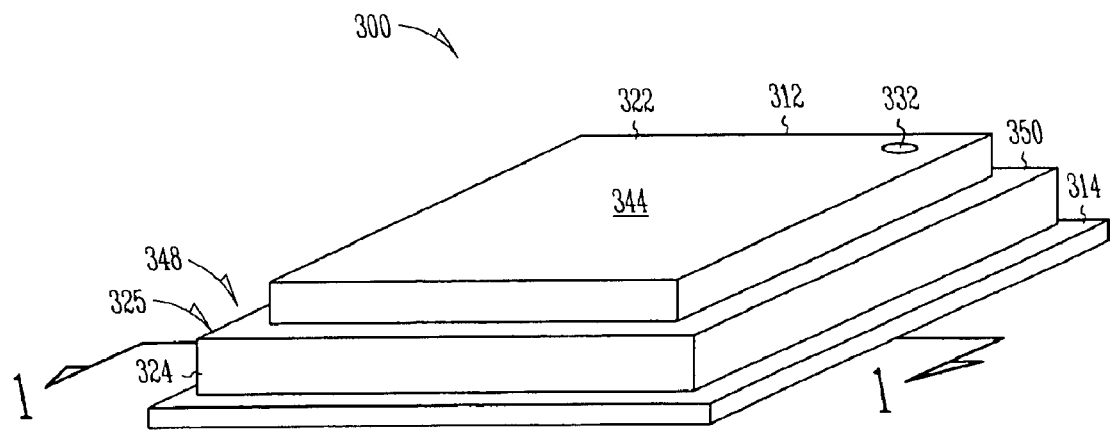
FIG. 3A is a perspective view of a microelectronic package according to an embodiment.

FIG. 3A is a perspective elevation of a microelectronic package 300 according to an embodiment. The microelectronic package 300 includes a downset edge IHS 312 which is disposed upon a mounting substrate 314. The downset edge IHS 312 includes a heat spreader body 322 and a downset edge 324. The downset edge 324 includes the downset edge wall 325, which in this embodiment essentially concentrically surrounds the heat spreader body 322 in a continuous manner. The top surface 344 is also referred to as a first surface 344. The downset edge wall 325 defines a boundary of a downset edge surface 350. The downset edge surface 350 is also referred to as a second surface 350. In FIG. 3A, the second surface 350 is disposed below the first surface 344 according to the orientation of the microelectronic package 300 as depicted. Because the downset edge wall 325 is substantially continuous around the heat spreader body 322, a vent hole 332 is provided. In one embodiment, no topside vent hole required. This embodiment is set forth subsequent with respect to other embodiments.

Figure 3B:
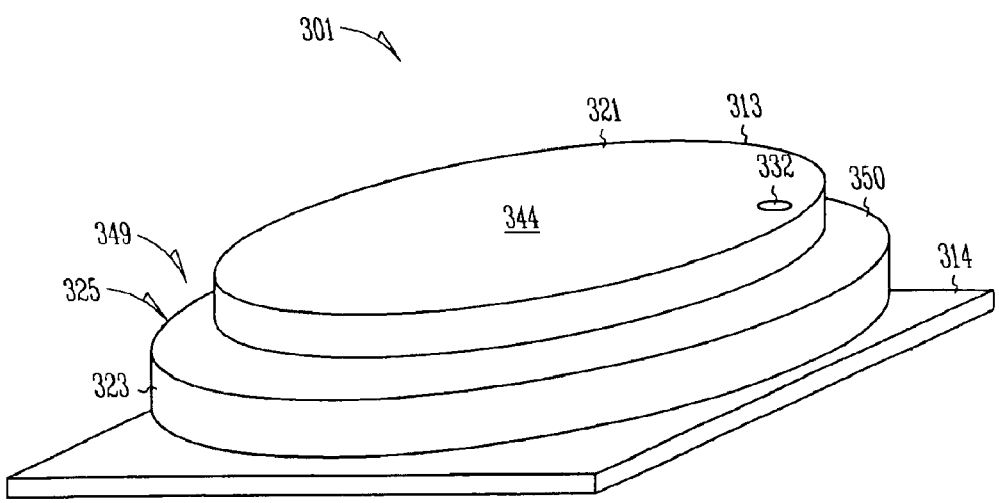
FIG. 3B is a perspective view of a microelectronic package according to an embodiment.

FIG. 3B is a perspective elevation of a microelectronic package 301 according to an embodiment. The microelectronic package 301 includes a downset edge IHS 313 which is disposed upon amounting substrate 314. The downset edge IHS 313 includes a heat spreader body 321 and a downset edge 323. The downset edge 324 includes the downset edge wall 325, which in this embodiment essentially concentrically surrounds the heat spreader body 321 in a continuous manner. The top surface 344 is also referred to as a first surface 344. The downset edge wall 325 defines a boundary of a downset edge surface 350. The downset edge surface 350 is also referred to as a second surface 350. In FIG. 3B, the second surface 350 is disposed below the first surface 344 according to the orientation of the microelectronic package 301 as depicted. Because the downset edge wall 325 is substantially continuous around the heat spreader body 321, a vent hole 332 is provided. A discussion of no topside vent hole required is set forth subsequent with respect to other embodiments. After review of the downset edge IHSs depicted in FIGS. 3A and 3B, one can read this disclosure and understand that other shapes can be achieved.

During ordinary usage of a die such as the die 110 depicted in FIG. 1, heat management requires resistance to warping and bending of the mounting substrate 114. This resistance to warping and bending, however, is in some ways limited to the immediate footprint of the downset edge IHS.

Figure 4A:
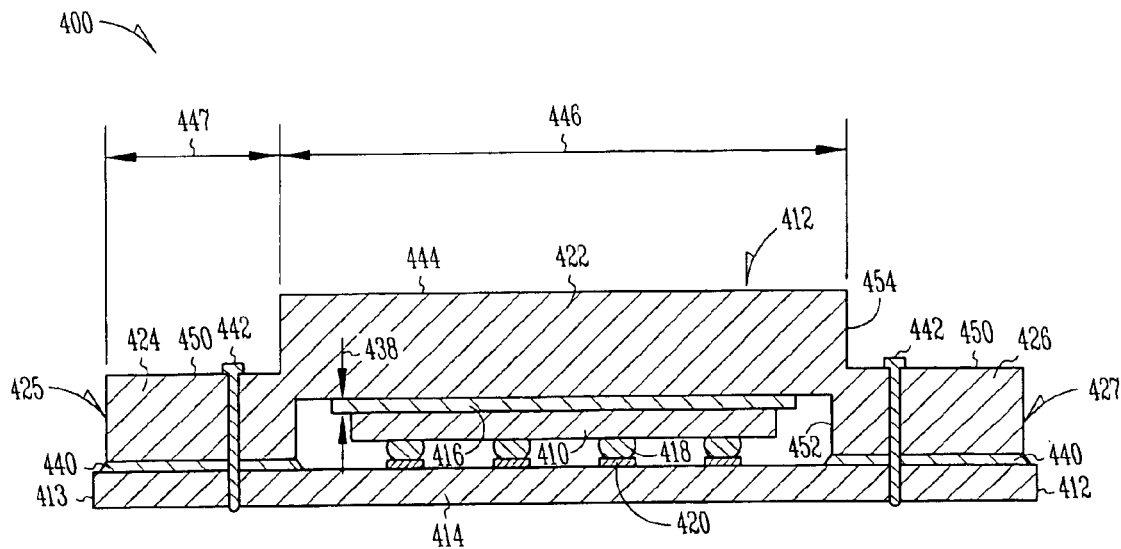
FIG. 4A is a cross section of a microelectronic package according to an embodiment.

FIG. 4A is a cross section of a microelectronic die package according to an embodiment. FIG. 4A depicts a microelectronic package 400 including a die 410, connected to a downset edge IHS 412 and a mounting substrate 414. Although no cladding layer is depicted in FIG. 4A, it is understood that a cladding layer such as at least one of the lower 211 and the upper 213 cladding layers (FIG. 2) can be employed in the embodiment depicted in FIG. 4A. An IHS adhesive layer 416 acts as a TIM to bond the die 410 to the downset edge IHS 412. The die 410 is coupled to the mounting substrate 414 through a series of electrical bumps 418 that are mounted on a series of bond pads 420 that are disposed upon the mounting substrate 414.

The downset edge IHS 414 includes a heat spreader body 422 and downset edges 424 and 426. The downset edges appear as feet 424, 426 portions of the downset edge IHS 412. Because the microelectronic package 400 is depicted in separate downset edges. The downset edge walls 425, 427 of the downset edges 424 and 426, respectively, form a perimeter. In one embodiment, the perimeter, delineated at the downset edge walls 425 and 427, concentrically surrounds the heat spreader body 422 and it also delineates the entire perimeter of the downset edge IHS 412.

In this embodiment, a top surface 444 of the downset edge IHS 412 is set above a downset edge surface 450. Further in this embodiment, the downset edge surface 450 extends substantially to the edge 413 of the mounting substrate 414. Where the downset edge IHS 412 is substantially stiffer than the mounting substrate 414, the portion of the downset edge IHS 412 that includes the downset edges 424 and 426, provides substantial resistance to warping and bending of the microelectronic package 400 during ordinary field use. Further because most of the downset edges 424 and 426 are remote from the die 410 where heat is generated, thermal expansion is minimized at the downset edges 424 and 426. This minimization of thermal expansions of the downset edges 424 and 426 also results in less warping and bending of the mounting substrate 414.

In one embodiment, the fastener 442 is a screw. In one embodiment, the fastener 442 is a nut and bolt assembly. In one embodiment, the fastener 442 is a staple. In one embodiment, the fastener 442 is a rivet. In one embodiment, the fastener 442 is a snap. In one embodiment, the fastener 442 is a press-fit taper pin. In one embodiment, the fastener 442 is a press pin. In one embodiment, the fastener is a clip (see FIGS. 5A and 5B). By reading this disclosure and practicing the embodiments, it should be apparent that any one, or a combination of fasteners set forth herein, and their respective equivalents can be used if desired.

The downset edge IHS 412 also exhibits two metrics regarding the exposed amount of horizontal upper 444 and lower 450 surfaces. As an aspect ratio, the length 446 of the heat spreader body 422, can be divided by the length 447 of the downset edge 424 or 426. In one embodiment, the aspect ratio is in a range from about 100:1 to about 0.2:1. This aspect ratio range can also encompass the embodiments depicted in FIGS. 1–6.

Figure 4B:
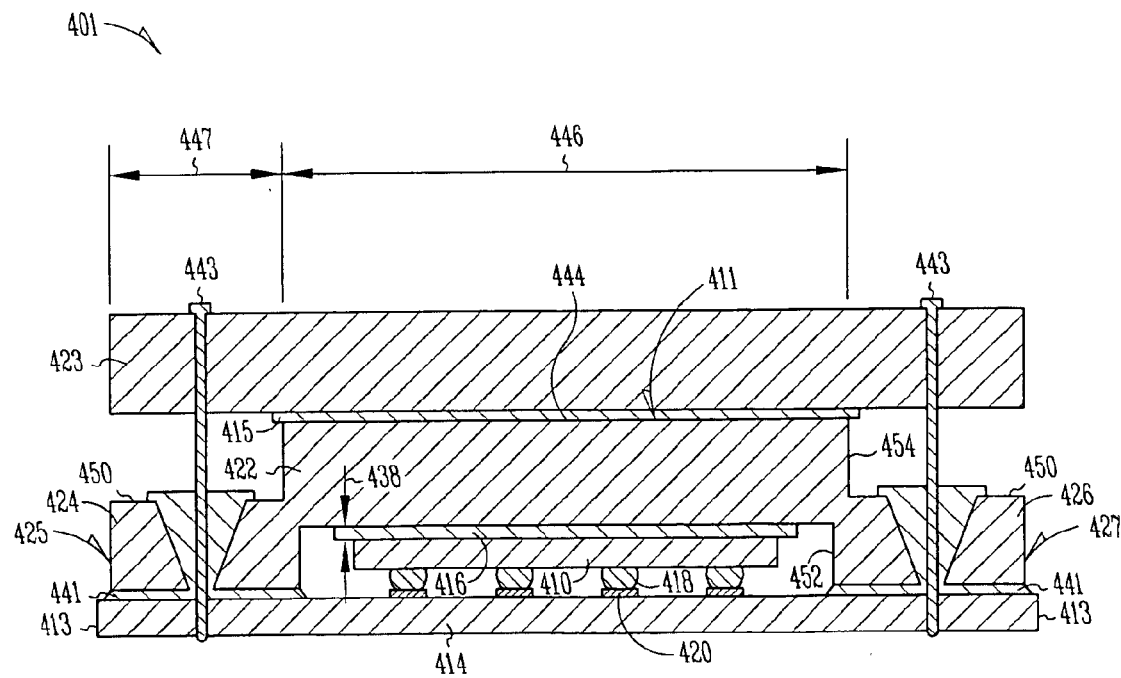
FIG. 4B is a cross section of a microelectronic package according to an embodiment.

FIG. 4B is a cross section of a microelectronic die package according to an embodiment. FIG. 4B depicts a microelectronic package 401 including a die 410, connected to a downset edge IHS 411 and a mounting substrate 414. Although no cladding layer is depicted in FIG. 4B, it is understood that a cladding layer such as at least one of lower 211 and the upper 213 cladding layers (FIG. 2) can be employed in the embodiment depicted in FIG. 4B. An IHS adhesive layer 416 acts as a TIM to bond the die 410 to the downset edge IHS 411. The die 410 is coupled to the mounting substrate 414 through a series of electrical bumps 418 that are mounted on a series of bond pads 420 that are disposed upon the mounting substrate 414.

The downset edge IHS 414 includes a heat spreader body 422 and downset edges 424 and 426. The downset edges appear as feet 424, 426 portions of the downset edge IHS 411. Because the microelectronic package 400 is depicted in orthogonal cross section, the downset edges 424 and 426 are depicted as two separate downset edges. The downset edge walls 425, 427 of the downset edges 424 and 426, respectively, form a perimeter. In one embodiment, the perimeter, delineated at the downset edge walls 425 and 427, concentrically surrounds the heat spreader body 422 and it also delineates the entire perimeter of the downset edge IHS 412.

In one embodiment, the downset edge IHS 411 is attached to the mounting substrate 414 by an attachment material 441, such as a polymer or other sealant. In one embodiment the attachment material 441 is applied to at least a portion of the downset edges 424 or 426.

In one embodiment, the attachment material 441 fills a recess in the downset edges 424 and 426. In one embodiment, the attachment material 441 overflows onto the downset edge surface 450. In one embodiment the recess has substantially tapered sidewalls, which form a locking structure when filled with the attachment material. In one embodiment the recess has substantially vertical sidewalls (not pictured).

Attachment of the downset edge IHS 411 to the mounting substrate 414 may be by any number of the methods, including but not limited to pressing, application of epoxy, soldering, or any suitable method known in the art.

Additionally, mechanical attachment devices, such as a fasteners 443 may be used to attach the downset edge IHS 411 to the mounting substrate. In one embodiment, the fastener 443 is a screw. In one embodiment, the fastener 443 is a nut and bolt assembly. In one embodiment, the fastener 443 is a staple. In one embodiment, the fastener 443 is a rivet. In one embodiment, the fastener 443 is a snap. In one embodiment, the fastener 443 is a press-fit taper pin. In one embodiment, the fastener 443 is a press pin. In one embodiment, the fastener is a clip (see FIGS. 5A and 5B). By reading this disclosure and practicing the embodiments, it should be apparent that any one, or a combination of fasteners set forth herein, and their respective equivalents can be used if desired.

FIG. 4B also illustrates the presence of a heat slug 423 that is thermally coupled to the die 410 through a second TIM (TIM 2) 415. In one embodiment, the TIM 2 415, along with the fasteners 443 minimizes what is often referred to as "tilt" in orientation of the heat slug 423 with respect to the IHS 413. It is also noted that the heat slug 423 can be any thermally enabling solution as is known in the art, including but not limited to a finned heat sink, a heat pipe, and others.

Figure 5:
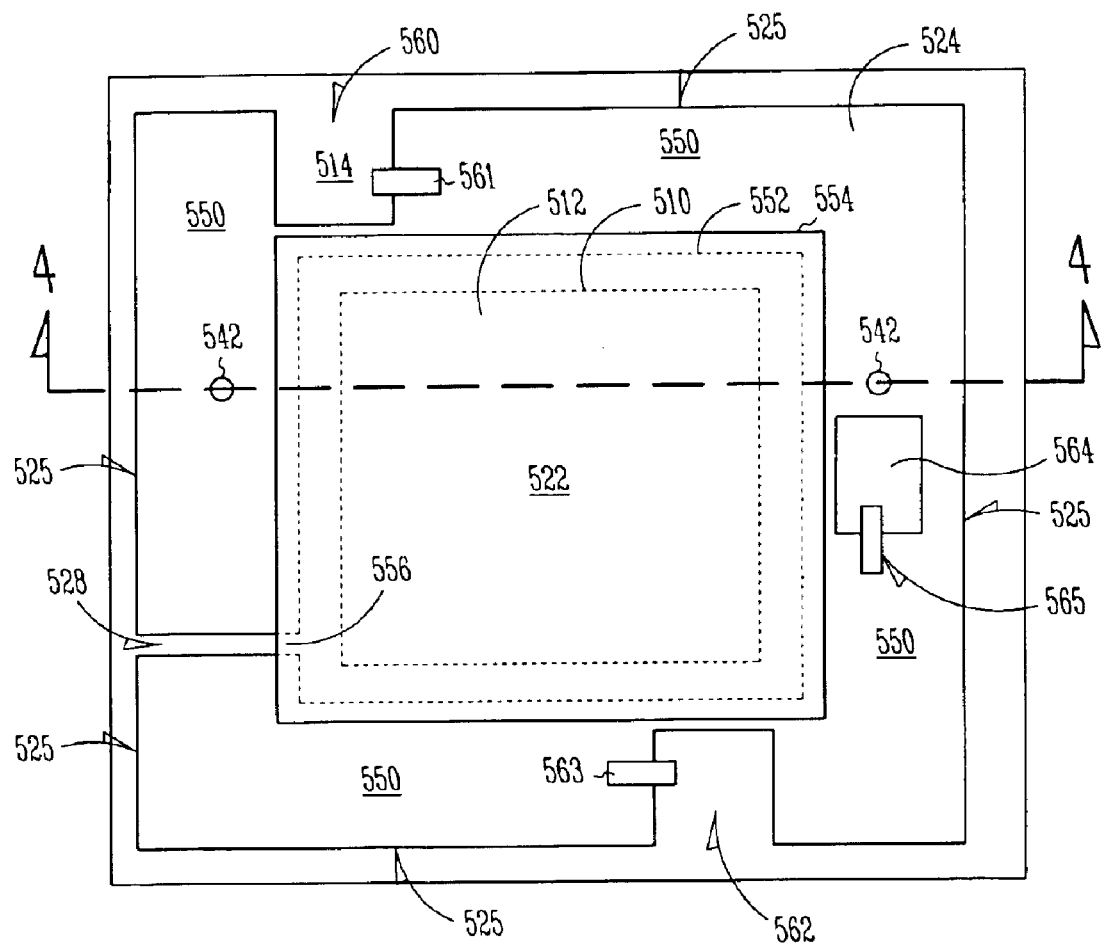
FIG. 5 is a plan view of the microelectronic packaged depicted in FIG. 4A.

FIG. 5 is a plan view of the microelectronic package depicted in FIG. 4. The cross section of FIG. 4A is taken from FIG. 5, along the line 4—4. FIG. 5 includes a die 510, depicted in phantom lines, disposed upon a mounting substrate 514, and covered by a downset edge IHS 512 which includes an intermittent lip 525 which can be substantially concentric to the perimeter of the die 510. In one embodiment, this intermittent lip 525 may eliminate or reduce the need for a vent hole such as vent hole 332 of FIG. 3, which, as stated previously, serves the primary purpose of providing pressure relief inside the package. In one embodiment, the intermittent lip 525 delineates the downset edge wall, also referred to in part as item 525. The perimeter, however, is not limited to the downset edge wall 525. Where a break in the downset edge wall 525 occurs, the perimeter deviates from a uniform distance from the geometric center of the heat spreader body 522.

Referring again to FIG. 4A, the downset edge IHS 412 includes a downset edge region that includes an inner wall 452 and an outer wall 454. In FIG. 5, the downset region includes an inner wall 552, depicted in phantom lines, and an outer wall 554. In one embodiment, a channel 556 communicates between the inner wall 552 and the outer wall 554. Further in one embodiment, a channel recess 528 breaks the perimeter of the downset edge wall 525, and exposes the mounting substrate 514 in the region of the channel 556. In one embodiment, the channel recess 528 communicates through the downset edge 525.

Other component recesses 560, 562, and 564 are depicted in arbitrary numbers and locations along the downset edge IHS 512. In one embodiment, at least one of the component recesses 560, 562, and 564 communicates through the downset edge 524. By the occurrence of at least one of the channel recess 528 and component recesses 560 and 562 the intermittent lip 525 is present in the downset edge IHS 512 because each breaks the perimeter of the downset edge wall 525. By the occurrence of the component recess 564, the mounting substrate 514 is exposed, but the downset edge wall 525 is continuous in the region of the component recess 564 and the perimeter of the downset edge wall 525 is not broken at this location. In one embodiment, the presence of a recess such as one of the recesses 528, 560, 562, and 564 allows for articles such as electronic components and/or leads to be mounted upon the mounting substrate 514. In one embodiment, a decoupling capacitor (not pictured) is disposed in a recess upon the mounting substrate 514. Other components known in the art can be disposed in a recess as described and claimed.

Corresponding to the respective recesses 560, 562, and 564, clips 561, 563, and 565 are depicted as being mounted upon the mounting substrate 514 at a sub-lower level, and simultaneously mounted upon the lower level 550 which is the downset edge 424, 426 (see FIG. 4) of the downset edge IHS 512. The clips 561, 563, and 565 are depicted as utilitarian and generic. The clips 561, 563, and 565 or at least one of them, however, can be customized to meet a given application. The clips 561, 563, and 565 are depicted in addition to the fasteners 442.

Figure 6A:
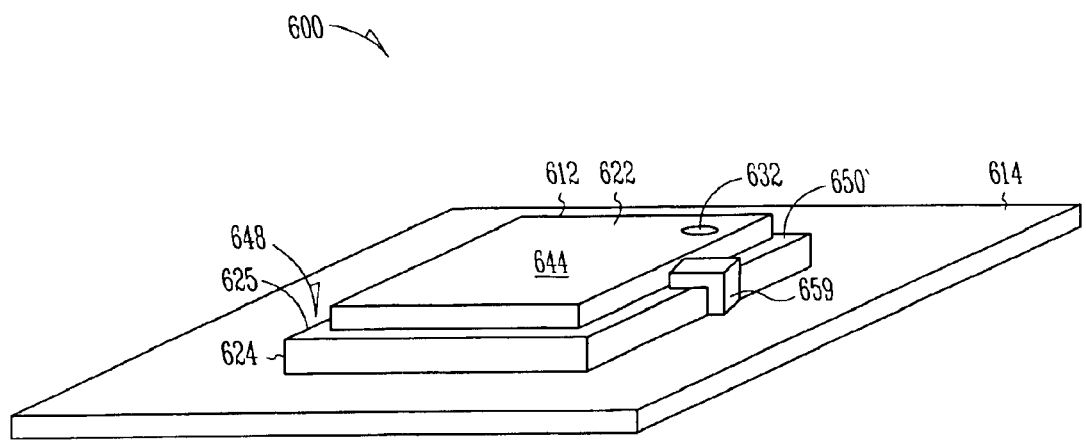
FIGS. 6A and 6B are perspective views of microelectronic packages according to embodiments.

FIG. 6A is a perspective view of a microelectronic package according to an embodiment. The microelectronic package 600 includes a die (not shown) which is enclosed within a downset edge IHS 612. The die and the downset edge IHS 612 are disposed upon a mounting substrate 614. The upper surface 644 of the downset edge IHS 612 includes the heat spreader body 622 and a vent hole 632. According to embodiments set forth herein, the downset edge 624 includes a downset edge wall 625, which can surround and/or be substantially concentric to the heat spreader body 622. The downset edge IHS 612 includes a notch 648 which is formed during manufacture of the downset edge IHS 612 according to embodiments set forth in this disclosure. A clip 659 is disposed upon the lower surface 650 of the downset edge IHS 612, and also upon the sub-lower surface which is the surface of the mounting substrate 614.

In one embodiment, a clip 659 is fixed into position during pick-and-place fabrication of the microelectronic package 600. In one embodiment, the clip 659 is fixed into position by a snap according to conventional technique. In one embodiment, a fastener is used such as the fasteners 542 depicted in FIG. 5A.

Figure 6B:
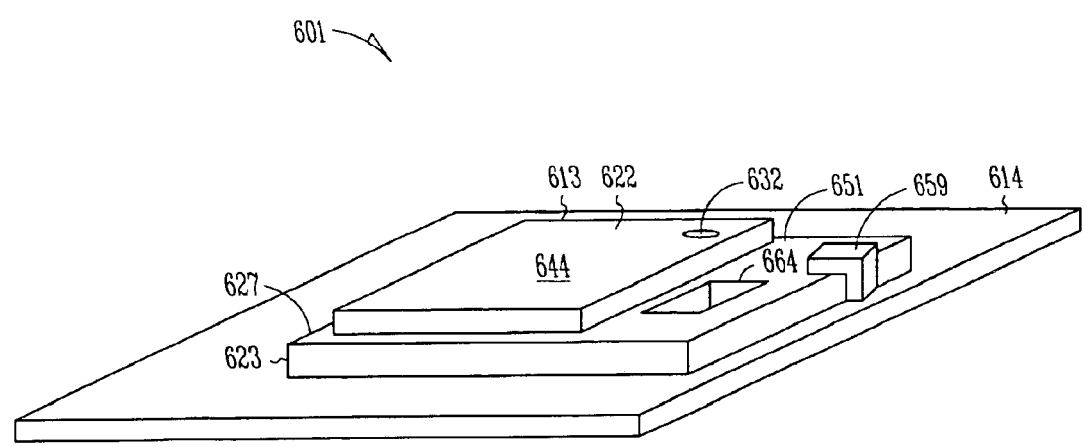

FIG. 6B is a perspective view of a microelectronic package according to an alternative embodiment. The microelectronic package 601 includes a die (not shown) which is enclosed within a downset edge IHS 613. The die and the downset edge IHS 613 are disposed upon a mounting substrate 614. The upper surface 644 of the downset edge IHS 613 includes the heat spreader body 622 and a vent hole 632. According to embodiments set forth herein, the downset edge 623 includes a downset edge wall 627 which surrounds and is substantially asymmetrical with respect to the heat spreader body 622. A clip 659 is disposed upon the lower surface 651 of the downset edge IHS 613, and also upon the sub-lower surface which is the surface of the mounting substrate 614. In one embodiment, a fastener is used such as the fasteners 542 depicted in FIG. 5A.

It can now be appreciated that, although only one part of the downset edge 623 is depicted as substantially asymmetrical with respect to the heat spreader body 622, more than one part of the downset edge 623 can be substantially asymmetrical. Further with respect to the channel and component recesses depicted in FIG. 5, such channel and/or component recesses, or one of them, or at least one of each of them, can be placed into the downset edge IHS 613 according to a specific application. In FIG. 6B, a component recess 664 is depicted by way of non-limiting example It can also be appreciated that a channel such as the channel 556 in FIG. 5 can also be placed into a downset edge IHS such as the downset edge IHS 601 depicted in FIG. 6B. By such placement, the vent hole 632 can be omitted.

Figure 7:
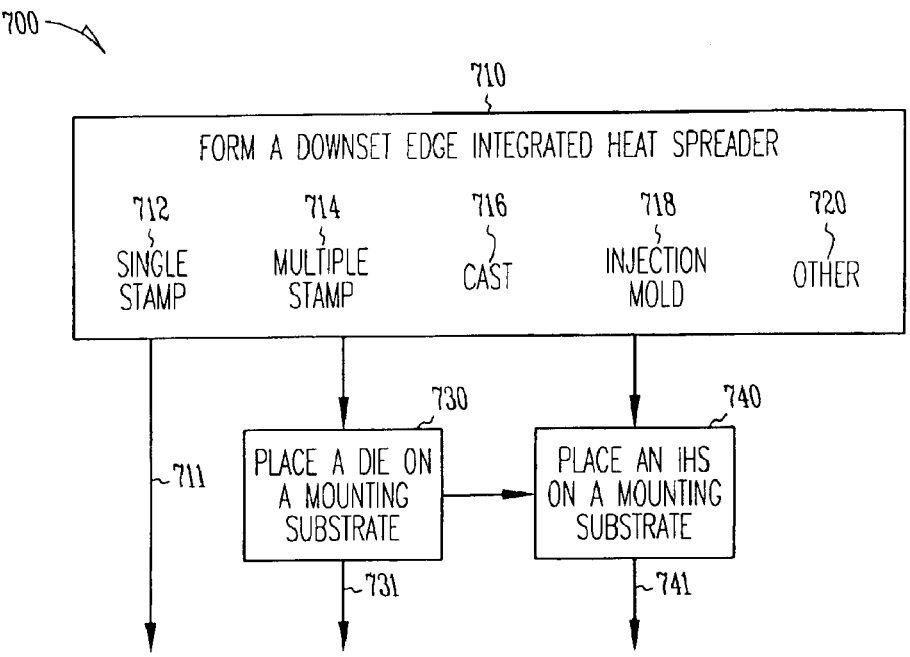
FIG. 7 is a process flow diagram according to an embodiment.

FIG. 7 is a process flow diagram according to an embodiment. The fabrication of a microelectronic package includes the formation of the downset edge IHS according to embodiments set forth in this disclosure. The process 700 includes embodiments which relate to the formation of a downset edge IHS.

At 710, a downset edge IHS is formed. At 712, the downset edge IHS is formed by single-stamping a metal blank according any of the various embodiments set forth in this disclosure. At 714, the downset edge IHS is formed by multiple-stamping a metal blank according any of the various embodiments set forth in this disclosure. At 716, the downset edge IHS is formed by casting a metal blank according any of the various embodiments set forth in this disclosure. At 718, the downset edge IHS is formed by injection molding a metal blank according any of the various embodiments set forth in this disclosure. At 720, the downset edge IHS is formed by any other conventional forming technique according any of the various embodiments set forth in this disclosure. It can be appreciated that cladding the metal blank can precede, follow, or coincide with formation of the downset edge IHS 710. At 711, one process embodiment is completed.

At 730, a die is placed upon a mounting substrate. At 731, one method embodiment is completed.

At 740, a downset edge IHS is placed over the die, and also upon the mounting substrate. At 741, one method embodiment is completed.

The several embodiments set forth in this disclosure are described primarily in the context of utilization with an integrated circuit flip-chip configuration, packaged with a substrate and heat spreader as shown in the accompanying figures. Other embodiments, however, can be employed that are not limited to just this particular configuration, and the claimed subject matter is applicable to other types of microelectronic packages. For example, microelectronic packages in accordance with the claimed subject matter may include packages with varying form factors, such as, for example, pin grid array, ball grid array, ball grid array with pinned interposers and wire bonding.

Figure 8:
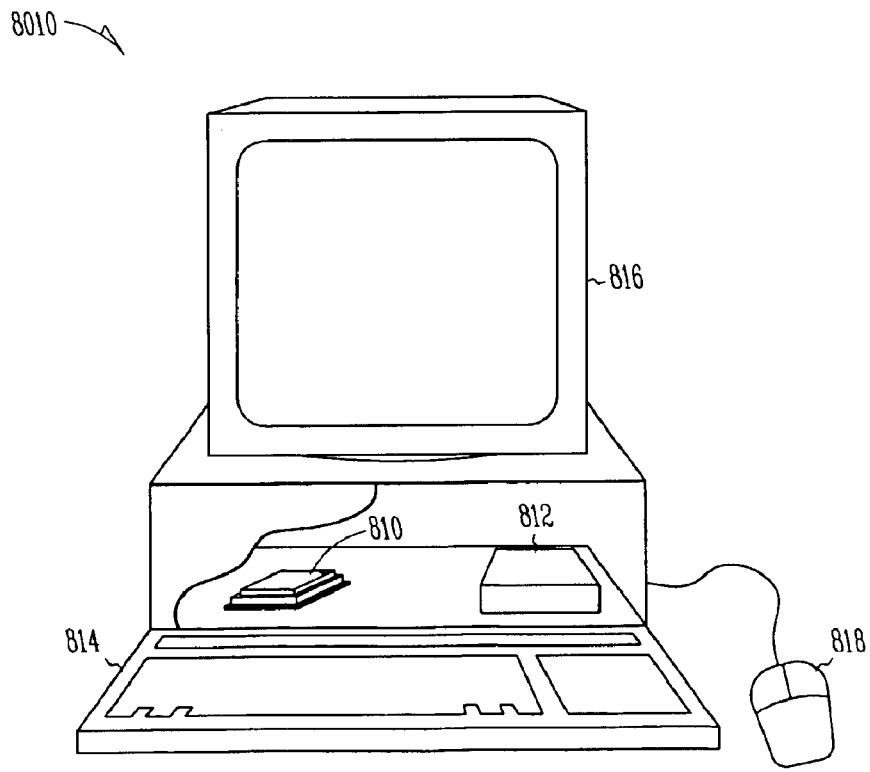
FIG. 8 is a depiction of a computer system.

FIG. 8 is a depiction of a computing system. One or more of the foregoing embodiments of a microelectronic package may be utilized in a computing system, such as a computing system 800 of FIG. 8. The computing system 800 includes at least one processor (not pictured) under a downset edge IHS 810, a data storage system 812, at least one input device such as keyboard 814, and at least one output device such as monitor 816, for example. The computing system 800 includes a processor that processes data signals, and may comprise, for example, a PENTIUM®III or PENTIUM® 4 microprocessor, available from Intel Corporation. In addition to the keyboard 814, the computing system 800 can include another user input device such as a mouse 818, for example. The computing system 800 may utilize one or more microelectronic packages such as described in one or more of the foregoing embodiments. For purposes of this application, a computing system 800 embodying components in accordance with the claimed subject matter may include any system that utilizes a microelectronic package, which may include, for example, a data storage device such as dynamic random access memory, polymer memory, flash memory, and phase-change memory. The microelectronic package can also include a die which contains a digital signal processor (DSP), a micro controller, an application specific integrated circuit (ASIC), or a microprocessor. It can now be appreciated that embodiments set forth in this disclosure can be applied to devices and apparatuses other than a traditional computer. For example, a die can be packaged with an embodiment of the downset edge IHS and placed in a portable device such as a wireless communicator or a hand-held device such as a personal data assistant and the like. Another example is a die which can be packaged with an embodiment of the downset edge IHS and placed in a vehicle such as an automobile, a locomotive, a watercraft, an aircraft, or a spacecraft.

It is emphasized that the Abstract is provided to comply with 37 C.F.R. §1.72(b) requiring an Abstract that will allow the reader to quickly ascertain the nature and gist of the technical disclosure. It is submitted with the understanding In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An integrated heat spreader comprising:
   a heat spreader body including a top surface and a bottom surface;
   a downset edge including a downset edge wall and a downset edge surface, wherein the downset edge wall substantially surrounds the heat spreader body, wherein the downset edge surface is downset from the heat spreader body bottom surface by a foot height, and wherein the foot height defines a container recess;
   a downset region disposed between the heat spreader body and the downset edge, wherein the downset region includes an inner wall and an outer wall; and
   a channel in the downset edge wall which communicates between the inner wall and the outer wall.

2. The integrated heat spreader according to claim 1, wherein the downset edge wall is substantially concentric with the heat spreader body.

3. The integrated heat spreader according to claim 1, wherein the downset edge wall is substantially concentric with the heat spreader body, and wherein the downset edge wall is substantially continuous.

4. The integrated heat spreader according to claim 1, wherein the downset edge wall is substantially concentric with the heat spreader body, and wherein the downset edge wall is intermittent.

5. The integrated heat spreader according to claim 1, further including:
   a channel recess which communicates through the downset edge surface.

6. The integrated heat spreader according to claim 1, further including:
   a component recess which communicates through the downset edge surface.

7. The integrated heat spreader according to claim 1, further including:
   a component recess in the downset edge surface, wherein the component recess communicates through the downset edge surface, and wherein the component recess creates an intermittent lip in the downset edge wall.

8. The integrated heat spreader according to claim 1, wherein the integrated heat spreader includes a material selected from copper-containing, aluminum-containing, ceramic, graphite, carbon structures, diamond, and consolidated metal powder, further including:
   at least one of a lower cladding and an upper cladding disposed on the integrated heat spreader.

9. The integrated heat spreader according to claim 1, further including:
   at least one of a lower cladding and an upper cladding disposed on the integrated heat spreader.

10. A microelectronic package comprising:
    a microelectronic die disposed upon a mounting substrate; and
    a downset edge integrated heat spreader, including:
      a heat spreader body including a top surface and a bottom surface; and
      a downset edge including a downset edge wall and a downset edge surface, wherein the downset edge wall substantially surrounds the heat spreader body, wherein the downset edge surface is downset from the heat spreader body bottom surface by a foot height, and wherein the foot height defines a container recess;
      a channel in the downset edge surface which communicates between the inner wall and the outer wall; and
      a channel recess which exposes the mounting substrate in the region of the channel.

11. The microelectronic package according to claim 10, further including:
    a fastener connected between the downset edge integrated heat spreader and the mounting substrate.

12. The microelectronic package according to claim 10, further including:
    a component recess in the downset edge surface, wherein the component recess exposes the mounting substrate through the downset edge surface.

13. The microelectronic package according to claim 10, further including:
    a component recess in the downset edge surface, wherein the component recess exposes the mounting substrate through the downset edge surface, and wherein the component recess creates an intermittent lip in the downset edge wall.

14. The microelectronic package according to claim 10, further including:
    a cladding disposed upon the downset edge integrated heat spreader.

15. The microelectronic package of claim 10, wherein the downset edge wall is substantially concentric with the heat spreader body.

16. The microelectronic package of claim 10, wherein the downset edge wall is substantially concentric with the heat spreader body, and wherein the downset edge wall is substantially continuous.

17. The microelectronic package of claim 10, wherein the downset edge wall is substantially concentric with the heat spreader body, and wherein the downset edge wall is intermittent.

18. The microelectronic package of claim 10, further including:
    a component recess which communicates through the downset edge surface.

19. The microelectronic package of claim 10, further including:
    a component recess in the downset edge surface, wherein the component recess communicates through the downset edge surface, and wherein the component recess creates an intermittent lip in the downset edge wall.

20. A computer system comprising:
    a microelectronic die disposed upon a mounting substrate; and
    a downset edge integrated heat spreader disposed over the microelectronic die, the downset edge integrated heat spreader including:
      a heat spreader body including a top surface and a bottom surface; and
      a downset edge including a downset edge wall and a downset edge surface, wherein the downset edge wall forms a perimeter that substantially surrounds the heat spreader body, and wherein the downset edge surface is downset from the heat spreader body bottom surface by a foot height, and wherein the foot height defines a container recess;
      a downset region disposed between the heat spreader body and the downset edge, wherein the downset region includes an inner wall and an outer wall; and a channel in the downset edge wall which communicates between the inner wall and the outer wall;

at least one of an input device and an output device; and dynamic random access data storage coupled to the microelectronic die.

21. The computer system according to claim 20, wherein the computer system is disposed in one of a computer, a wireless communicator, a hand-held device, an automobile, a locomotive, an aircraft, a watercraft, and a spacecraft.

22. The computer system according to claim 20, wherein the microelectronic die is selected from a data storage device, a digital signal processor, a micro controller, an application specific integrated circuit, and a microprocessor.

23. The computer system of claim 20, wherein the downset edge wall is substantially concentric with the heat spreader body.

24. The computer system of claim 20, wherein the downset edge wall is substantially concentric with the heat spreader body, and wherein the downset edge wall is substantially continuous.

25. The computer system of claim 20, wherein the downset edge wall is substantially concentric with the heat spreader body, and wherein the downset edge wall is intermittent.

26. The computer system of claim 20, further including:
a channel recess which communicates through the downset edge surface.

27. The computer system of claim 20, further including:
a component recess which communicates through the second surface.

28. The computer system of claim 20, further including:
a component recess in the second surface, wherein the component recess communicates through the second surface, and wherein the component recess creates an intermittent lip in the downset edge wall.

29. A microelectronic package comprising:

a microelectronic die disposed upon a mounting substrate; and a downset edge integrated heat spreader, including:
a heat spreader body including a including a top surface and a bottom surface; and
a downset edge including a downset edge wall and a downset edge surface, wherein the downset edge wall substantially surrounds the heat spreader body, wherein the downset edge surface is downset from the heat spreader body bottom surface by a foot height, and wherein the foot height defines a container recess;
a downset region disposed between the heat spreader body and the downset edge, wherein the downset region includes an inner wall and an outer wall; and
a channel recess in the downset edge surface which communicates between the inner wall and the outer wall.

30. The microelectronic package of claim 29, further including:
a channel recess which communicates through the downset edge surface.

* * * * *